United States Patent [19]

Yamamoto et al.

[11] Patent Number: 5,312,643
[45] Date of Patent: May 17, 1994

[54] METHOD OF PRODUCING A TRANSPARENT CONDUCTIVE FILM PROVIDED WITH SUPPLEMENTARY METAL LINES

[75] Inventors: Osamu Yamamoto, Hirakata; Kouji Nishimura, Miyazaki; Akira Isomi, Hirakata; Masahide Tsukamoto, Nara, all of Japan

[73] Assignee: Matsushita Electric Industrial Co., Ltd., Osaka, Japan

[21] Appl. No.: 795,022

[22] Filed: Nov. 20, 1991

[30] Foreign Application Priority Data

Nov. 20, 1990 [JP] Japan .................................. 2-317225

[51] Int. Cl.$^5$ .......................... B05D 5/12; C23C 14/00
[52] U.S. Cl. ................................ 427/108; 427/126.3; 427/125; 427/226; 427/229; 427/258; 427/404; 427/419.3; 204/192.29
[58] Field of Search ............... 427/109, 110, 419.3, 427/404, 126.3, 226, 229, 125, 258, 108, 248.1; 204/192.29

[56] References Cited

U.S. PATENT DOCUMENTS 4,775,549 10/1988 Ota et al. ........................... 427/126.3
4,888,210 12/1989 Isozaki et al. ....................... 427/226

OTHER PUBLICATIONS

Shimada et al., "Manufacturing of Fine-Line Films By Printing Technique", IMC (1990).

*Primary Examiner*—Shrive Beck
*Assistant Examiner*—David Maiorana
*Attorney, Agent, or Firm*—Wenderoth, Lind & Ponack

[57] ABSTRACT

A method of producing a transparent conductive film provided with supplementary metal lines, comprises the steps of forming a transparent conductive film composed mainly of indium oxide, tin oxide, or antimony oxide on a transparent substrate and forming metal lines through printing on the transparent conductive film by an intaglio or litho offset printing procedure a line pattern of metalorganic ink composed mainly of an organic noble metal containing gold, silver, or platinum and baking it for metallization.

6 Claims, 1 Drawing Sheet

METHOD OF PRODUCING A TRANSPARENT CONDUCTIVE FILM PROVIDED WITH SUPPLEMENTARY METAL LINES

BACKGROUND OF THE INVENTION

1. Field of the Invention

The present invention relates to a method of producing a transparent conductive film for use with a liquid crystal display.

2. Description of the Prior Art

Liquid crystal displays which are widely used as display units of portable calculators or watches, television receivers, and visual display terminals of OA devices, have been improved in performance and increased in screen size.

Such a liquid crystal display has a transparent conductive film thereof which serves as an electrode and is substantially produced by coating a planar, polished glass substrate with a layer of silicon dioxide ($SiO_2$) for preventing penetration of alkali ions, forming on the silicon dioxide layer by sputtering a transparent conductive thin film of a ceramic material consisted mainly of indium tin oxide (ITO)-a mixture of indium oxide and tin oxide, and etching the ITO thin film by a photolithograph patterning technique.

As a further enlargement of a display panel and operation with high-speed response are now desired, such a transparent conductive film is intended to be low in resistance. However, the ITO thin film produced by a known sputtering technique exhibits as high as $1 \times 10^{-4} \Omega \cdot cm$ of resistivity, failing to satisfy the foregoing requirement. For improvement, a transparent conductive film accompanied with auxiliary metal lines has been proposed which is produced by arranging a pattern of auxiliary metal lines, a dozen or more of micrometers in line width, of e.g. a nickelchrome alloy over a transparent film.

In the prior art, a desired pattern of auxiliary metal lines is developed by forming a thin film of a nickel-chrome or gold-chrome alloy on a transparent conductive film, forming a photoresist pattern by a photolithograph technique on the thin film, and etching the thin film of nickel-chrome or gold-chrome alloy by chemically removing the unwanted portions. The prior art method however requires a considerable number of procedures including vacuum deposition, photolithograph processing, etching, and removal of photoresist materials. Also, a surplus of metal film regions are formed during the vacuum deposition thus increasing the cost of production.

Also, a screen printing technique is employed for forming a line pattern of metal resinate (a type of ink made from a metallorganic material), in which the pattern can cover a considerable area and the cost of production can be reduced. However, the pattern of lines is hardly developed at an accuracy of less than several tens of micrometers in the width of each line. Accordingly, no improvement has been attempted on the methods of forming supplementary metal lines on an ITO layer with the use of a known printing technique.

SUMMARY OF THE INVENTION

It is an object of the present invention to provide a method of producing a transparent conductive film provided with auxiliary metal lines, in which a pattern of auxiliary lines of metal-containing organic ink composed mainly of an organic noble metal compound is formed on a transparent conductive film composed mainly of indium oxide, tin oxide, or antimony oxide by a common printing procedure, e.g. an intaglio offset printing, and is baked for metallization.

It is known that a conventional transparent conductive film is formed by sputtering or electron-beam vapor deposition using a ceramic target composed mainly of indium oxide, tin oxide, or antimony oxide. However, the cost of forming such films and metallic pattern layers is high. For reduction of the cost, an intaglio offset printing technique is used for printing on a transparent substrate a desired pattern of a metallorganic ink composed mainly of an organic indium, organic tin, or organic antimony material. The pattern of ink is then baked for metallization, thus forming the transparent conductive film at less cost. The organic noble metal compound is preferably such a compound that gold, silver, or platinum is coupled to an alkyl base which contains sulfur and also, an additive which contains a lead substance and the same ingredients as of the transparent conductive film, may be contained for increasing the adhesivity.

In addition, the intaglio offset printing technique employs an intaglio formed of a mono-crystal silicon wafer or silica glass plate which is dry etched and a blanket roller formed of silicone rubber so that a line pattern of the organic noble compound-containing ink can be printed at an accuracy of less than several tens of micrometers in the width of each line. Through our experiments, it was found that equally accurate line patterns were obtained through repeating a common litho offset printing action a few times.

As understood, each auxiliary metal line may extend along the center line of the transparent conductive film strip although it is opaque thus decreasing the transmission of light more or less. Hence, it is a good idea that the auxiliary metal line is arranged for covering one edge of the transparent conductive film strip and also, partially extending along the gap between the two adjacent transparent conductive film strips. Accordingly, the transparent conductive film provided with the auxiliary metal lines will be improved in light transmissibility.

More specifically, the method of the present invention allows a pattern of auxiliary metal lines to be produced by printing a line pattern of metallorganic ink composed mainly of an organic noble metal compound by an intaglio offset printing technique and baking it for metallization so that a resultant transparent conductive film can be minimized in the resistivity thus to contribute to the large size of a display panel and the high-speed response in operation and also, fabricated at considerably lower cost.

DESCRIPTION OF THE PREFERRED EMBODIMENTS

Figure 1:
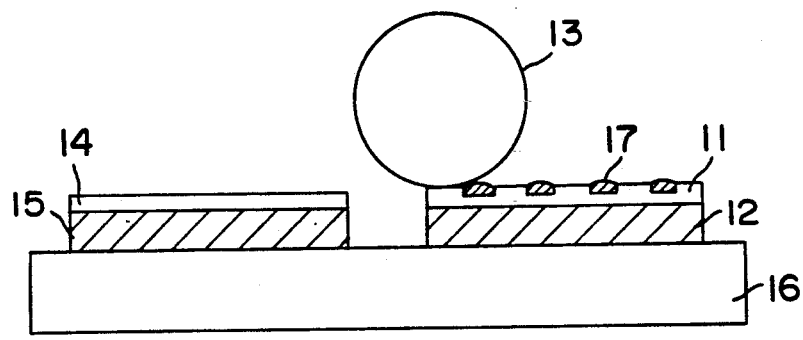
FIG. 1 is a schematic view of an intaglio offset printing procedure showing a first embodiment of the present invention.
Figure 2:
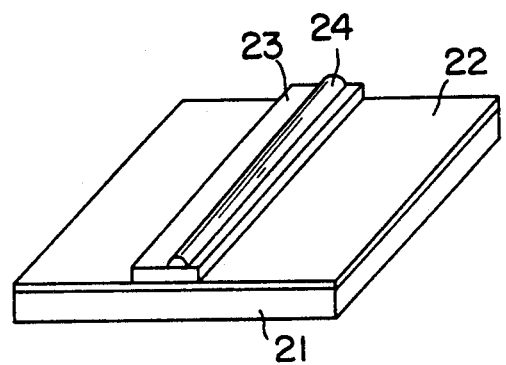
FIG. 2 is a schematic view of a transparent conductive film with supplementary metal lines produced by the method of the first embodiment of the present invention.

A first embodiment of the present invention will be described referring to the accompanying drawings. FIG. 1 illustrates an intaglio offset printing procedure showing the first embodiment of the present invention. FIG. 2 is a schematic partial view of a transparent conductive film with auxiliary lines produced by the method of the first embodiment of the present invention. As shown in FIG. 1, there are provided a mono-crystal silicon intaglio 11. An intaglio mounting base 12, a blanket roll 13, an ITO patterning plate 14, a plate mounting base 15, a traveling table 16, a gold resinate ink 17, a glass substrate 21, and SiO$_2$ layer 22, an ITO film 23, and an auxiliary metal line 24.

The method of producing a desired pattern of such auxiliary metal lines will now be explained. Through sputtering procedures, an SiO$_2$ layer 22 of about 0.1 μm in thickness was produced on the glass substrate 21 which was made of soda-lime glass and exhibited an acceptable degree of surface flatness and then, an ITO layer of about 0.2 micrometer in thickness was formed on the SiO$_2$ layer 22 (at 220° C. of the substrate temperature). The ITO layer was etched by a photolithograph technique to a desired pattern of the ITO film 23 (where each pattern line was 340 μm in width).

The resultant ITO patterning plate 14 was placed on the plate mounting base 15 while the mono-crystal silicon intaglio 11 which has a pattern of grooves of 10 μm wide and 10 μm deep, arranged in the surface thereof by a dry etching (or ion milling) technique to corresponding with an auxiliary electrode pattern, was overlaid on the intaglio mounting base 12. After a positional match between the ITO patterning plate 14 and the mono-crystal silicon intaglio 11 was established, the intaglio 11 was coated with an amount of gold resinate ink 17 (gold diisobutyl isopropyl thiolate/indium octylate/lead octylate/terpineol) which was spread through squeezing or scraping (for filling up the grooves). Then, the blanket roll 13 of silicone rubber was pressed down against the mono-crystal silicon intaglio 11 so that the line pattern of the ink 17 was transferred onto the surface of the blanket roll 13 during movement of the traveling table 16. As the table 16 was traveling further, the ink pattern on the blanket roll 13 was printed on the ITO film 23 of the patterning plate 14 thus forming a pattern of gold resinate lines of 9 μm wide. As compared with the prior art intaglio offset printing method, the method of the present invention employs a mono-crystal silicon plate as the intaglio which is dry etched and thus, has the grooves arranged advantageously in the squareness of cross-section and also, in respect to a blanket roll made of a most preferable material. It should be noted that an intaglio made of silica glass is also favorable in dry etched results and can be used with equal success.

The ITO patterning plate 14 carrying the gold resinate pattern on the ITO layer was baked at 500° C. in the presence of air for 30 minutes for decarbonization and metallization. As a result, the pattern of the auxiliary metal lines 24 (0.12 μm in thickness) was formed and thus, a transparent conductive film provided with the same was completed. The resultant ITO transparent conductive film provided with the auxiliary metal lines exhibited an average resistivity of $4 \times 10^{-5} \Omega$·cm.

The method of forming an ITO layer is not limited to the known sputtering technique but can be a vacuum vapor deposition technique, e.g. electron beam heating vapor deposition.

Also, the baking at as a low temperature as 500° C. is feasible thanks to the addition of a small amount of lead octylate to the gold resinate material. The adhesion strength between the auxiliary metal lines and the ITO layer was found as high as 350 kg/cm$^2$ because the gold resinate material was mixed with a small amount of indium octylate and also, its metallorganic component contained sulfur (thiolate).

Figure 3:
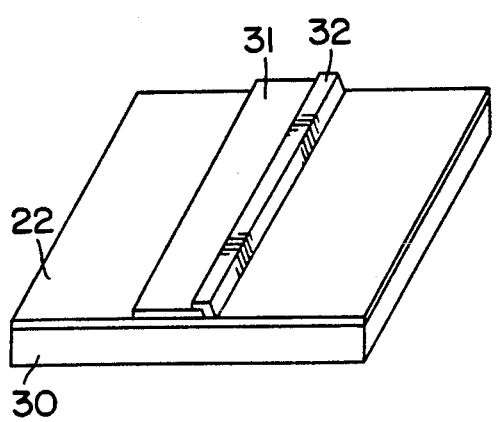
FIG. 3 is a schematic view of a transparent conductive film with auxiliary metal lines produced by the method of a second embodiment of the present invention.

A second embodiment of the present invention will now be described. FIG. 3 shows a schematic view of a transparent conductive film with auxiliary metal lines produced according to the second embodiment, in which 30 is a borosilicate glass substrate, 31 is a transparent conductive film, and 32 is an auxiliary silver metal line.

The method of producing such a transparent conductive film with auxiliary metal lines of the second embodiment will be explained. A line pattern (330 μm in line width) of ITO resinate ink (indium 2-ethylhexoate/tin p-toluilate/butyl carbitol acetate) was printed on the borosilicate glass substrate 30, which has an acceptable degree of surface flatness, using an intaglio offset printing procedure similar to the first embodiment. After being dried out at 120° C. for about 20 minutes, the ITO resinate pattern was coated at top with a corresponding layer pattern of silver resinate ink (silver octylate/lead octylate/terpineol) through repeating a common litho offset printing action three times.

The two ink patterns on the glass substrate 30 were then baked at 580° C. for 45 minutes for metallization, thus converting to the transparent conductive film 31 (of 0.2 μm in thickness) composed of indium oxide and tin oxide and the auxiliary silver metal lines 32 (of 35 μm in width and 0.2 μm in thickness) respectively. Each auxiliary silver metal line 32 was arranged for covering one edge of the ITO film strip 31 and also, extending along the gap between the two adjacent ITO film strips so that unwanted declination in the transmission of light can be avoided. Although the resistivity of the conductive ITO film with the auxiliary silver metal lines was $1 \times 10^{-4} \Omega$·cm equal to that of a conventional ITO conductive film, the steps of the production process were minimized as compared with the prior art method and will thus contribute to the cost down of the finished film product.

Figure 4:
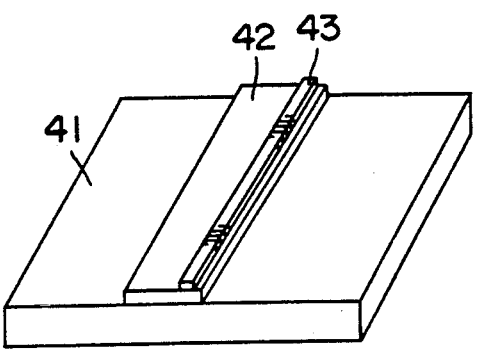
FIG. 4 is a schematic view of a transparent conductive film with auxiliary metal lines produced by the method of a third embodiment of the present invention.

A third embodiment of the present invention will be described. FIG. 4 shows a transparent conductive film with auxiliary metal lines produced according to the third embodiment, in which denoted by 41 is a silica glass substrate, 42 is a transparent conductive film, and 43 is a an auxiliary platinum metal line. The method of producing such a transparent conductive film with auxiliary metal lines of the third embodiment will be explained.

A 0.2-μm-thick layer of tin oxide and antimony was first produced by direct sputtering on the silica glass substrate 41 (at a temperature of 280° C.) and then, shaped by a photolithograph technique into a desired line pattern (340 μm in line width). As a result, the transparent conductive film 42 composed of tin oxide and antimony oxide was obtained. Then, a line pattern of platinum resinate ink (platinum octylate/silicon octylate/terpineol) was printed by an intaglio offset printing method, equal to that of the first embodiment, on the transparent conductive film 42 with the use of a silica glass plate which serves as the intaglio and has grooves (of 25 μm wide and 15 μm deep) formed by dry etching in the atmosphere of $CF_4$ gas. The resultant line pattern of the platinum resinate ink was baked at 650° C. for 35 minutes for metallization, thus forming the auxiliary metal lines 43 of 22 μm wide and 0.15 μm thick on the transparent conductive film 42. No lead was needed for adding to the silica glass plate which is substantially high in the thermal resistance. Also, the bonding strength between the auxiliary platinum metal lines and the transparent conductive film was found appreciable due to high-temperature heating, without addition of sulfur to the platinum resinate material. The resistivity of the finished transparent conductive film with the auxiliary platinum metal lines was as low as $2.5 \times 10^{-5} \Omega \cdot cm$ in average.

As set forth above, the method of the present invention allows a pattern of gold, silver, or platinum metal lines to be formed on the transparent conductive film using an optimum printing technique (preferably, intaglio offset printing), thus producing transparent conductive film, lowered in the resistivity at less cost.

What is claimed is:

1. A method of producing a transparent conductive film provided with an auxiliary metal electrode, comprising the steps of:

forming a transparent conductive film composed mainly of a metal oxide selected from the group consisting of indium oxide, tin oxide and antimony oxide on a transparent substrate;

printing a pattern of metallorganic ink composed mainly of an organic noble metal compound on the transparent conductive film by an intaglio offset printing method using an intaglio which is made of a mono-crystal silicon wafer or silica glass plate on which a pattern of grooves have been formed by dry etching, the pattern of grooves having a width of 10 μm or less and a depth of 10 μm or more; and baking for metallizing the pattern of metallorganic ink to obtain an auxiliary metal electrode composed mainly of noble metal on the transparent conductive film, the auxiliary metal electrode having a width of 10 μm or less.

2. A method according to claim 1, wherein the intaglio printing method comprises the steps of:

filling the pattern of grooves on the intaglio with the metallorganic ink to form a pattern of metallorganic ink on the intaglio;

pressing a blanket whose surface is made of silicone rubber on the intaglio to transfer the pattern of metallorganic ink formed on the intaglio onto the surface of the blanket; and pressing the blanket having formed on the surface thereof the transferred pattern of metallorganic ink onto the transparent conductive film formed on the substrate to transfer the pattern of metallorganic ink on the surface of the blanket onto the transparent conductive film.

3. A method according to claim 1, wherein the transparent conductive film forming step comprises a step of depositing a conductive material composed mainly of a metal oxide selected from the group consisting of indium oxide, tin oxide and antimony oxide on the transparent substrate by physical vapor deposition.

4. A method according to claim 1, wherein the transparent conductive film forming step comprises the steps of printing a metallorganic ink composed mainly of an organic metal compound selected from the group consisting of an organic indium compound, an organic tin compound and an organic antimony compound on the transparent substrate, and baking for metallizing the metallorganic ink formed on the transparent substrate.

5. A method according to claim 1, wherein the organic noble metal compound is a member selected from the group consisting of an organic gold compound, an organic silver compound and an organic platinum compound.

6. A method according to claim 1, wherein the auxiliary metal electrode is formed so as to cover at least one edge of the transparent conductive film.

* * * * *